United States Patent
Sutherland

(10) Patent No.: US 10,835,978 B2
(45) Date of Patent: Nov. 17, 2020

(54) LOGO ON A DEVICE

(71) Applicant: HEWLETT-PACKARD DEVELOPMENT COMPANY, L.P., Houston, TX (US)

(72) Inventor: Timothy J Sutherland, San Diego, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/091,030

(22) PCT Filed: Jul. 6, 2016

(86) PCT No.: PCT/US2016/041082
§ 371 (c)(1),
(2) Date: Oct. 3, 2018

(87) PCT Pub. No.: WO2018/009180
PCT Pub. Date: Jan. 11, 2018

(65) Prior Publication Data
US 2019/0091784 A1    Mar. 28, 2019

(51) Int. Cl.

| B23K 1/20 | (2006.01) |
|---|---|
| B23K 1/005 | (2006.01) |
| B44C 1/22 | (2006.01) |
| B41M 5/24 | (2006.01) |
| B23K 26/352 | (2014.01) |
| B44C 1/26 | (2006.01) |
| B44C 3/10 | (2006.01) |

(Continued)

(52) U.S. Cl.
CPC .............. *B23K 1/20* (2013.01); *B23K 1/0056* (2013.01); *B23K 26/352* (2015.10); *B23K 26/355* (2018.08); *B23K 26/359* (2015.10); *B41M 5/24* (2013.01); *B44C 1/228* (2013.01); *B44C 1/26* (2013.01); *B44C 3/10* (2013.01); *C23C 18/18* (2013.01); *H05K 5/0252* (2013.01); *H05K 5/03* (2013.01); *B23K 2101/36* (2018.08); *B29C 45/03* (2013.01); *B29L 2031/3481* (2013.01); *H01Q 1/12* (2013.01); *H04M 1/0283* (2013.01)

(58) Field of Classification Search
CPC .... B23K 1/0056; B23K 1/20; B23K 2101/36; B23K 26/352; B23K 26/355; B23K 26/359

See application file for complete search history.

(56) References Cited

U.S. PATENT DOCUMENTS 6,494,593 B2    12/2002    An et al.
6,874,903 B2     4/2005    Yang
(Continued)

FOREIGN PATENT DOCUMENTS

| DE | 102005041375 A1 | 3/2007 |
|---|---|---|
| RU | 94033709 A1 | 7/1996 |
| RU | 2490709 C2 | 8/2013 |

OTHER PUBLICATIONS

Brad Linder, "Asus Transformer Book T100 Review: Rebirth of the Affordable Portable PC", Aug. 11, 2013.

*Primary Examiner* — Minh N Trinh
(74) *Attorney, Agent, or Firm* — HPI Patent Department

(57) ABSTRACT

In some examples, a method of forming a logo on a device includes forming, using a laser, a pattern on an outer surface of a housing of the device, and soldering a metal to the pattern formed using the laser, the soldered metal forming the logo.

18 Claims, 6 Drawing Sheets

(51) Int. Cl.
*B23K 26/359* (2014.01)
*C23C 18/18* (2006.01)
*H05K 5/02* (2006.01)
*H05K 5/03* (2006.01)
*H04M 1/02* (2006.01)
*B23K 101/36* (2006.01)
*B29C 45/03* (2006.01)
*B29L 31/34* (2006.01)
*H01Q 1/12* (2006.01)

(56) References Cited

U.S. PATENT DOCUMENTS

| | | | | |
|---|---|---|---|---|
| 7,812,256 B2* | 10/2010 | Zhan | ................... | H04M 1/0283 174/50 |
| 8,273,986 B2* | 9/2012 | Liu | ................... | H04M 1/0283 174/60 |
| 8,325,094 B2* | 12/2012 | Ayala Vazquez | .... | H01Q 1/2258 343/700 MS |
| 9,070,313 B2 | 6/2015 | Trzakos et al. | | |
| 9,092,199 B2 | 7/2015 | Tanaka | | |
| 9,306,268 B2* | 4/2016 | Hwang | ................... | H01Q 1/243 |
| 2009/0153412 A1* | 6/2009 | Chiang | ................... | H01Q 1/52 343/702 |
| 2009/0194308 A1* | 8/2009 | Cheng | ................... | B32B 15/01 174/50 |
| 2011/0048754 A1* | 3/2011 | Xiong | ................. | H05K 5/0243 174/50 |
| 2011/0095088 A1* | 4/2011 | Lezhnev | .......... | G06K 19/06037 235/491 |
| 2011/0250400 A1* | 10/2011 | Lee | ................... | B29C 45/0053 428/161 |
| 2012/0241185 A1 | 9/2012 | Hsu et al. | | |
| 2013/0052376 A1 | 2/2013 | Ho et al. | | |

* cited by examiner

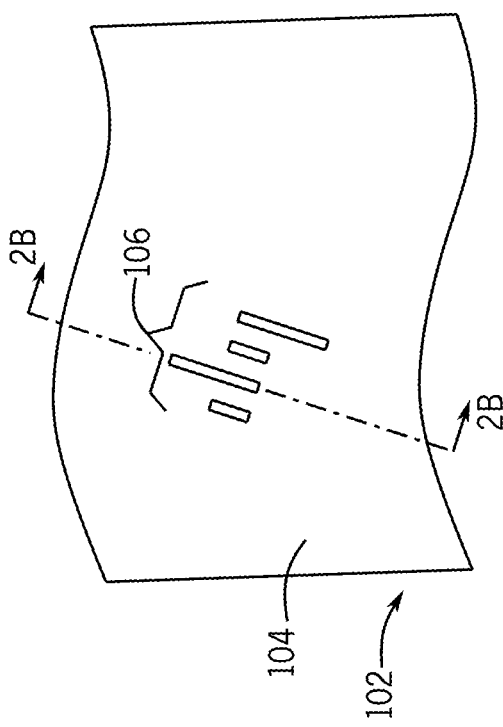
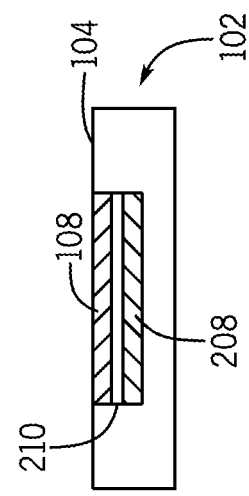
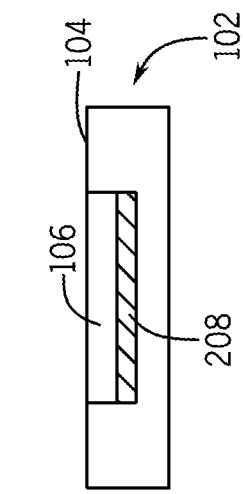
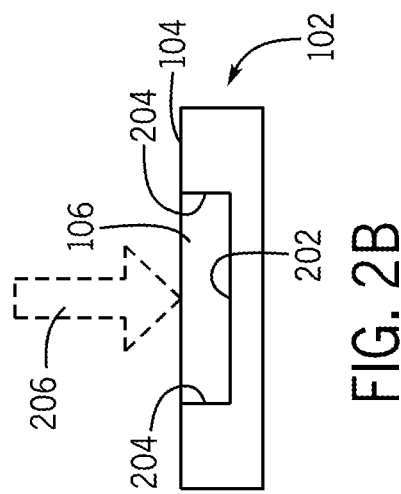
FIG. 2A
FIG. 2B
FIG. 2C
FIG. 2D

LOGO ON A DEVICE

BACKGROUND

An electronic device can include a housing that contains electronic components inside the housing. To identify a manufacturer or other source of the electronic device, a logo can be provided on the outer housing.

BRIEF DESCRIPTION OF THE DRAWINGS

Some implementations of the present disclosure are described with respect to the following figures.

FIG. 2A is a top view of a portion of a housing formed with grooves for a logo, according to some examples.

FIGS. 2B-2D illustrate an example of providing a metal segment for a logo in a groove, according to some examples

DETAILED DESCRIPTION

A logo can be provided on an outer surface of a housing of a device. The device on which a logo can be provided can be an electronic device, such as a notebook computer, a tablet computer, a desktop computer, a smartphone, a game appliance, a wearable device (e.g., a smart watch, smart eyeglasses, etc.), an appliance, a display device, a sound system, a printer, or any other type of electronic device. In addition, logos can be provided on other types of devices that do not include electronic components, such as furniture, decorative items, and so forth.

A "logo" can refer to any indicator that can be used to identify a manufacturer of a device, a source of a device, or any other entity (e.g., a business concern, an educational organization, a government agency, an individual, etc.) that is associated with a device. A logo can include text, character strings, symbols, graphics, or any combination of the foregoing.

In some examples, a logo can be attached to an outer surface of a device housing using an adhesive. However, over time and use of a device, portions of the logo may become detached from the housing of a device, which is aesthetically undesirable.

In accordance with some implementations of the present disclosure, instead of attaching a logo using an adhesive to an outer surface of a housing of a device, metal segment(s) that form a logo can be soldered to a pattern formed on the housing outer surface. The pattern can be formed on the housing outer surface using a laser. The pattern formed by a laser beam from the laser allows for a metal plating process to be employed to form a metal layer on the pattern. Following formation of the metal layer on the pattern, a metal segment can be soldered to the metal layer on the pattern. The metal segment that is soldered to the housing forms a logo for the device. A metal segment forming the logo can refer to the logo formed entirely of the metal segment, or the metal segment being a part of the logo, which can include multiple metal segments. In either case, the logo formed of the metal segment(s) can include text, a character string(s), a symbol(s), a graphical image(s), or any combination of the foregoing.

By soldering the metal segment to the outer surface of the housing of a device, a stronger bond is created between the logo and the housing, such that it is less likely for the logo to fall off with use of the device.

Figure 1:
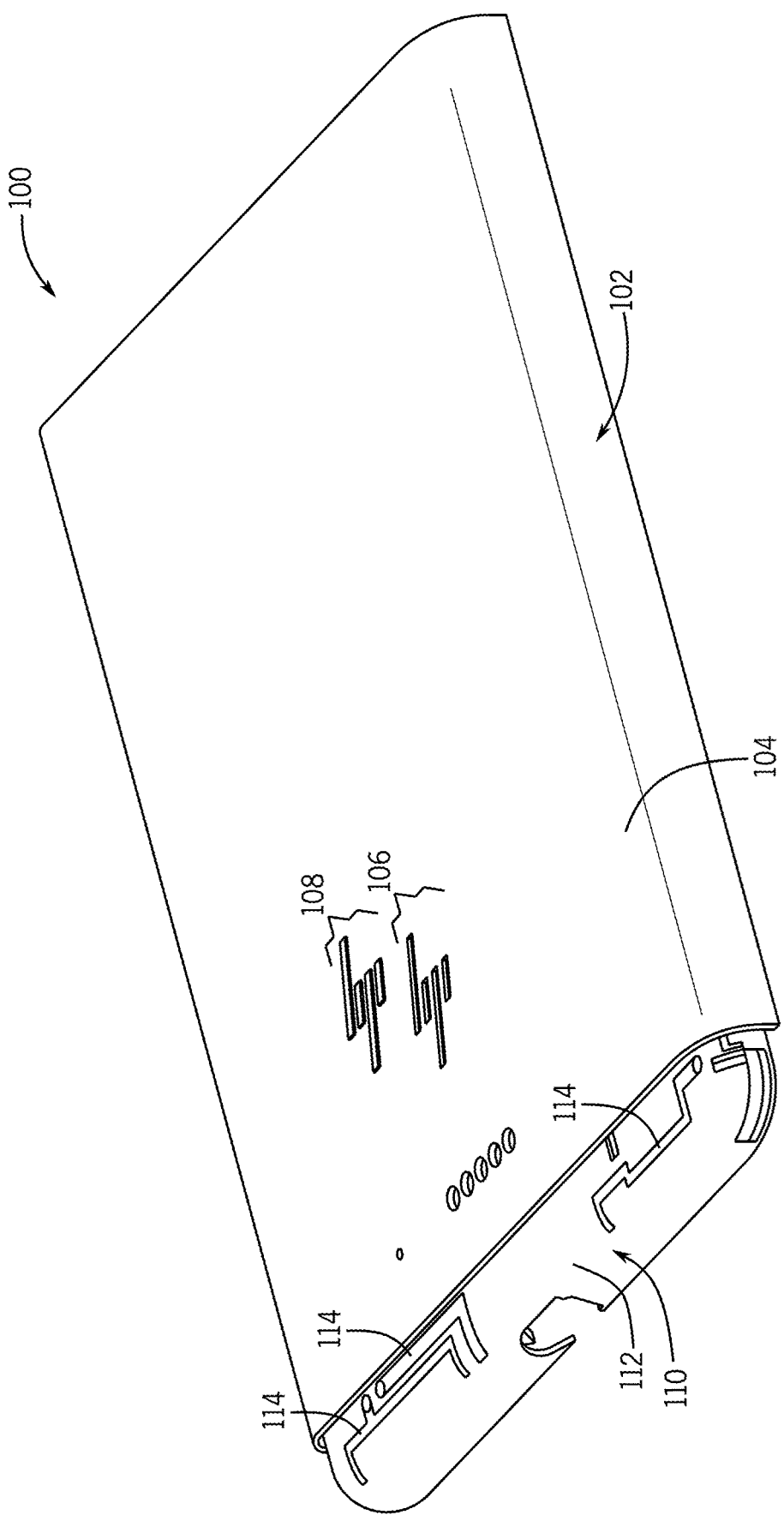
FIG. 1 is a perspective view of an electronic device including a logo formed using a technique according to some examples.

FIG. 1 is a perspective view of an electronic device 100, according to some examples. In some examples, the electronic device 100 can include electronic components, such as a processor, a memory, a communication interface, and so forth. In other examples, another type of device (without electronic components) can be provided.

The electronic device 100 includes an outer housing 102 that encloses components within the electronic device 100. The term "housing" can refer to a unitary housing structure or multiple housing structures that are attached to each other. In some examples, the outer housing 102 can be formed of a material that includes a thermoplastic. More generally, the outer housing 102 can be formed of a material that includes a polymer, a metal, or any other material that is relatively rigid and of sufficient strength to support components inside the electronic device 100.

In examples according to FIG. 1, multiple grooves 106 for a logo can be formed into an outer surface 104 of the outer housing 102. In examples according to FIG. 1, the outer surface 104 is a rear surface of the electronic device 100. In other examples, grooves for a logo can be formed on a different outer surface of the electronic device 100, such as a front surface or a side surface.

A "groove" can refer to an indentation, a recess, or any other cut or depression that can be formed into a layer of the outer housing 102. Although a specific number of grooves 106 are shown in FIG. 1, it is noted that in other examples, a different number of grooves (one groove or more than one groove) can be provided in the outer surface 104 of the outer housing 102.

Surface portions within the grooves 106 can be irradiated with a laser beam from a laser (or laser beams from multiple lasers). A laser can refer to a light source that generates a concentrated beam of light, which can be at a wavelength within a visible spectrum (visible to the human eye) or at a wavelength outside the visible spectrum (such as ultraviolet or infrared light).

The laser irradiation of the surface portions within the grooves 106 activates such surface portions in the grooves 106. The activation of a surface portion within a groove 106 causes a physio-chemical reaction that roughens the surface portion, which forms a pattern on the surface portion. The pattern on the surface portion can include a roughened profile on the surface portion, where the roughened profile can include micro-rough tracks or other micro structures (a "micro structure" can refer to a structure that has a size in the micrometer range).

In some examples, laser activation of the surface portions in the grooves 106 can be performed using a laser direct structuring (LDS) technique. For example, the housing 102 can be formed of a polymer, such as a plastic, which is doped with a metal. In such examples, the metal is an additive that has been added to the polymer. Doping the polymer with a metal can refer to mixing a metallic compound into the polymer material. Due to the presence of the metal in the polymer, exposing the material of the housing 102 to laser irradiation results in the physio-chemical reaction that roughens the surface portion.

The roughened profile provided by the pattern on the surface portion allows for metal plating to be applied to the surface portion in each groove 106. Metal plating performed on the pattern of the surface portion causes formation of a metal layer on the pattern of the surface portion. Metal plating can involve depositing a metal onto a surface.

Following the metal plating of the surface portions in the grooves 106, metal segments 108 that form a logo can be soldered onto the metal plated surface portions in the grooves 106. To solder a metal segment 108 to a metal-plated surface portion in a groove 106, a solder, which can be formed of a fusible metal alloy, is heated to melt the solder, such that the solder can join a metal segment 108 to a respective metal plated surface portion in the groove 106.

Once the metal segments 108 are soldered into the grooves 106, the metal segments 108 provide a logo for the electronic device 100 that is securely attached to the housing 102 of the electronic device 100.

In some examples, the metal segments 108 can be formed of a stainless steel, a material that contains nickel, or any other type of metal that is easily visible when provided in the grooves 106.

FIG. 1 also shows an inner housing 110 that can be provided underneath the outer housing 102. The outer housing 102 can at least partially encapsulate a portion of the inner housing 110. Although not shown, a cap or other cover structure can be attached to the outer housing 102 to cover the end portion of the inner housing 110 that is visible in FIG. 1. The inner housing 110 has an outer surface 112 on which can be formed a pattern 114 for an antenna of the electronic device 100. An antenna is used to communicate radio frequency (RF) signals to allow the electronic device 100 to perform wireless communications with another device. The pattern 114 that is formed on the outer surface 112 of the inner housing 110 can also be subjected to laser irradiation, to form the pattern 114. The irradiation applied to portions of the outer surface 112 can be the same type of irradiation (e.g., LDS irradiation) applied to the surface portions within the grooves 106. In fact, the irradiation of the portions of the outer surface 112 can be performed as part of the same manufacturing step (by a laser irradiation stage of a manufacturing equipment).

Following laser irradiation, the pattern 114 on the outer surface 112 of the inner housing is plated with a metal layer, where the plated metal layer on the pattern 114 forms the antenna of the electronic device 100. The antenna can be electrically connected to an electronic component (such as a circuit board, a transceiver, etc.) in the electronic device 100.

FIG. 2A is a top view of a portion of the outer housing 102, which shows the grooves 106 formed into the outer surface 104 of the outer housing 102. In some examples, the outer housing 102 along with the grooves 106 can be formed using an injection molding process, where an injection molding tool is used to form the outer housing 102 having a target shape and structure, such as the shape and structure shown in FIG. 1. In other examples, other techniques for forming the outer housing 102 and the grooves 106 can be used. For example, after the outer housing 102 is formed, the grooves 106 can be cut into the outer housing 102 using a cutting tool.

FIG. 2B is a cross sectional view of a portion of the housing 102 shown in FIG. 2A along section 2B-2B. The groove 106 shown in FIG. 2B includes a surface portion 202, which is the bottom surface of the groove 106. The groove 106 also includes sidewalls 204 that rise above the surface portion 202. FIG. 2B also shows a laser beam 206 from a laser, to irradiate the surface portion 202. The laser irradiation activates a layer of the outer housing 102 adjacent the surface portion 202, to cause roughening of the surface portion 202. This roughened surface portion 202 forms a pattern.

Following the laser irradiation, a metal plating process can be applied to the surface portion 202 of the groove 106, such as by dipping the outer housing 102 into a metallization bath that contains a liquid metal. As a result of dipping the outer housing 102 into the metallization bath, a metal binds to the roughened surface portion 202 to form a metal layer 208 on the surface portion 202 of the groove 106, as shown in FIG. 2C. In other examples, other processes can be employed to form the metal layer 208 in the groove 106. For example, a different metal deposition process (e.g., an electroplating process) can be used to deposit the metal layer 208 into the groove 106.

Following formation of the metal layer 208 on the surface portion 202 of the groove 106, soldering can be applied. As shown in FIG. 2D, soldering causes bonding of a metal segment 108 to the metal layer 208 using a solder layer 210. The metal segment 108 soldered into the groove 106 in combination with other metal segments 108 soldered into the other grooves 106 of FIG. 2A form a logo for the electronic device.

Figure 3A:
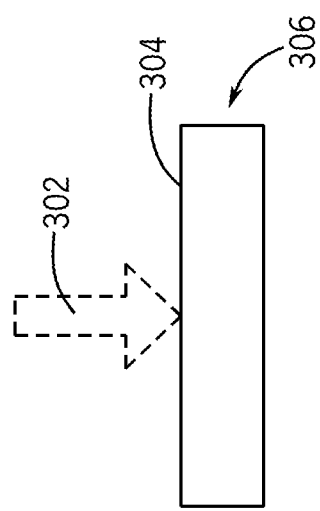
FIGS. 3A-3C illustrate an example of providing a metal segment for a logo on a flat outer surface, according to alternative examples.
Figure 3B:
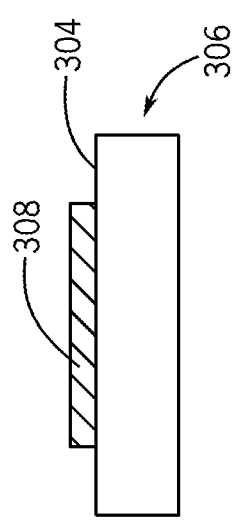
Figure 3C:
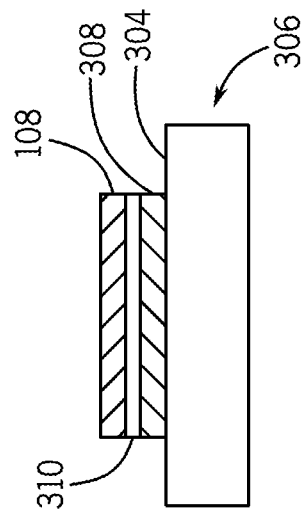

FIGS. 3A-3C depict a process of forming a logo according to alternative examples. In examples according to FIGS. 1 and 2A-2D, the logo is formed in grooves 106 formed in the outer surface 104 of the outer housing 102. In other examples, as shown in FIGS. 3A-3C, the logo can be formed onto a flat outer surface 304 of an outer housing 306 (without forming the grooves 106). In FIG. 3A, a laser beam 302 irradiates the flat outer surface 304 of the outer housing 306. The irradiation by the laser beam 302 forms a pattern (e.g., a roughened surface) on a surface portion of the outer surface 304. Following the formation of the pattern on the outer surface 304, a metal plating process is performed to form a metal layer 308 on the pattern irradiated by the laser beam 302, as shown in FIG. 3B. The metal plating process can include dipping the outer housing 306 into a metallization bath, or performing another type of deposition of the metal layer 308 onto the housing outer surface 304. Next, a metal segment 108 can be soldered to the metal layer 308 with a solder layer 310, as shown in FIG. 3C.

Figure 4:
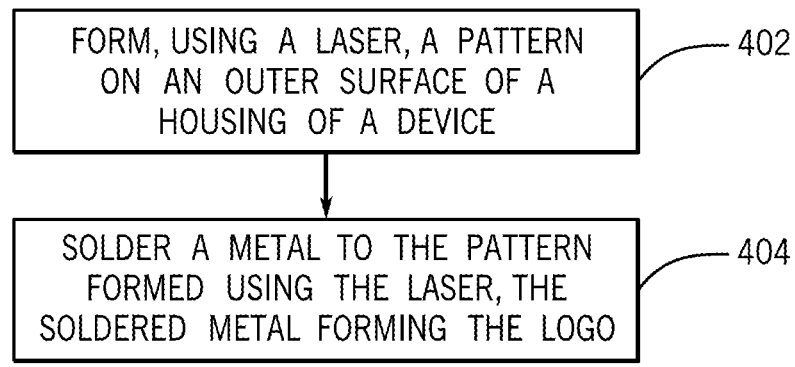
FIG. 4 is a flow diagram of a manufacturing process to form a logo on a housing of a device, according to some examples.

FIG. 4 is a flow diagram of a process of forming a logo on a device, according to some examples. The process includes forming (at 402), using a laser, a pattern on an outer surface of a housing (e.g., the outer housing 102 of FIGS. 1 and 2A-2D, or the outer housing 306 of FIGS. 3A-3C) of the device. The process further includes soldering (at 404) a metal to the pattern formed using the laser, the soldered metal forming the logo.

Figure 5:
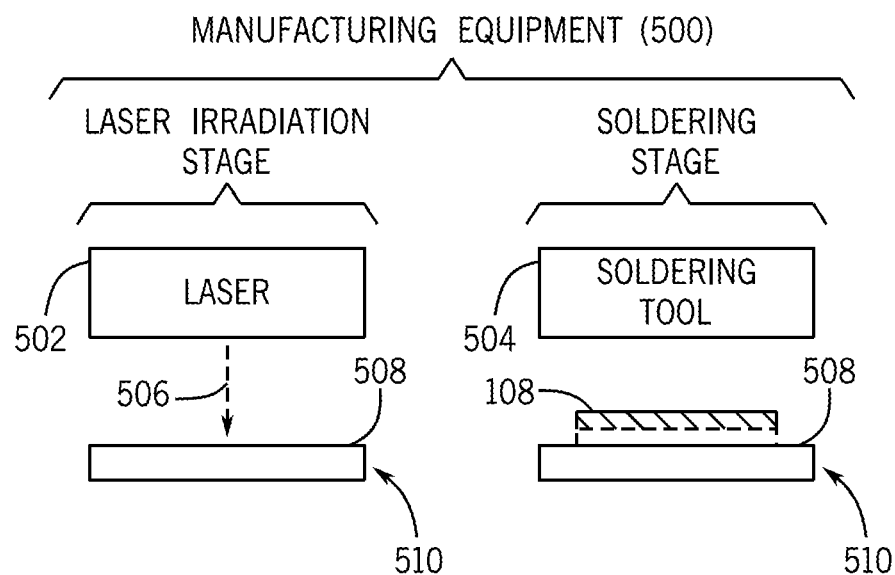
FIGS. 5 and 6 are block diagrams of manufacturing equipments according to some examples.

FIG. 5 is a block diagram of a manufacturing equipment 500 according to some examples, which can be used to form a housing of a device with a logo. The manufacturing equipment 500 includes multiple stages, where a laser irradiation stage includes a laser 502, and a soldering stage includes a soldering tool 504. The multiple stages of the manufacturing equipment 500 can be part of an assembly line, or can be located in different manufacturing facilities.

A device to be formed using the manufacturing equipment 500 can be moved between the multiple stages, such as manually or by a conveyor structure.

The laser 502 of the laser irradiating stage can emit a laser beam 506 directed at an outer surface 508 of an outer housing 510, where the outer surface 508 can be a flat outer surface or a surface portion within a groove. The laser irradiation forms a pattern on the outer surface 508 to which a logo is to be applied. Note that in some examples, the laser irradiating stage can also be used to form a pattern for an antenna as discussed above. The pattern for the antenna and the pattern for the logo can be formed on the device concurrently.

Following irradiation of the outer surface 508 to form the pattern on the outer surface 508, and following a metal plating process to form a metal layer onto the pattern (not shown in FIG. 5), the soldering tool 504 in the soldering stage of the manufacturing equipment 500 is activated to solder a metal segment 108 to the pattern formed by the laser irradiation on the outer surface 508. The soldered metal segment 108 forms a logo of a device.

Figure 6:
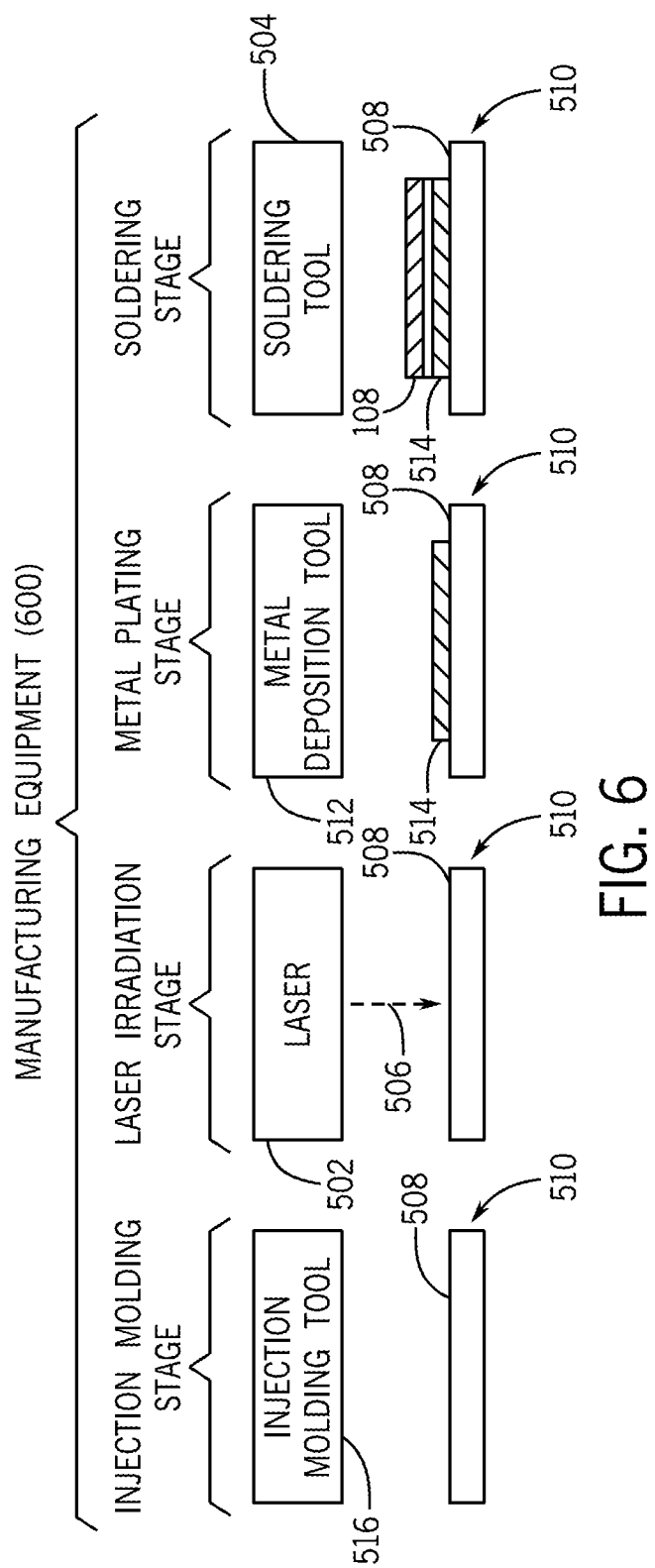

FIG. 6 is a block diagram of a manufacturing equipment 600 according to further implementations. The manufacturing equipment 600 includes the laser irradiation stage and the soldering stage of the manufacturing equipment 500 of FIG. 5. In addition, the manufacturing equipment 600 includes a metal plating stage that includes a metal deposition tool 512 to deposit a metal layer onto a pattern formed on an outer surface by the laser irradiation stage. In some examples, the metal deposition tool 512 includes a metallization bath, into which the outer housing 510 can be dipped following laser irradiation to plate a metal layer 514 onto the pattern formed by the laser irradiation. Alternatively, the metal deposition tool 512 can include an electroplating tool to deposit the metal layer 514 onto the pattern formed by the laser irradiation. In some examples, the metal plating stage can also be used to form a metal plate for an antenna of the device.

In addition, the manufacturing equipment 600 further includes an injection molding stage that includes an injection molding tool 516 that is used to form the housing 510 using an injection molding process to a target shape and structure, including any grooves such as the grooves 106 shown in FIG. 1. Injection molding involves injecting a target material (such as plastic doped with metal for an outer housing as discussed above) into a mold that has the target shape of the housing, including any grooves such as grooves 106.

Figure 7:
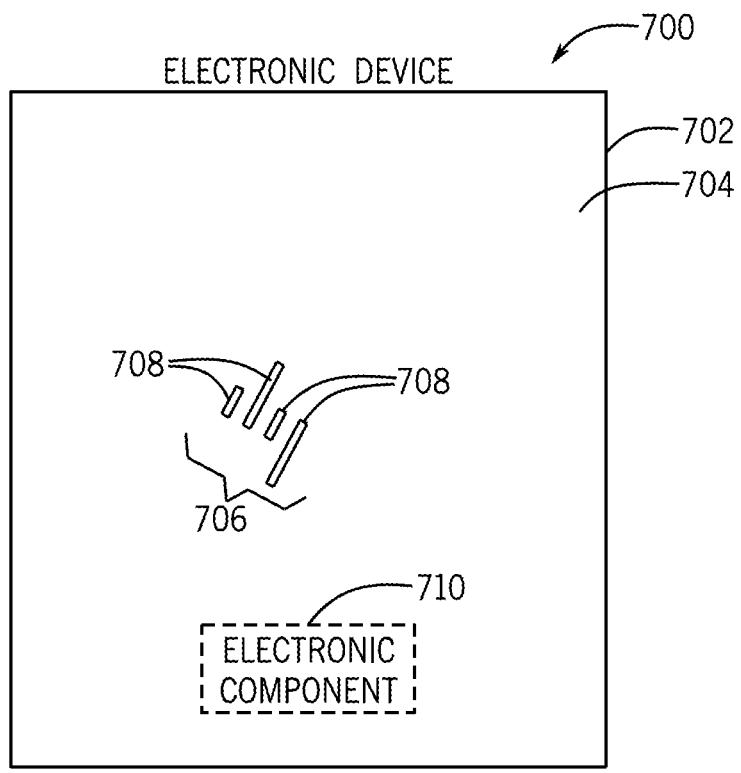
FIG. 7 is a block diagram of an electronic device with a logo formed according to further examples.

FIG. 7 is a block diagram of an electronic device 700 according to some examples. The electronic device 700 includes an outer housing 702 that has an outer surface 704. A logo 706 including metal segments 708 is soldered to metal layers plated to the outer surface 704 using laser direct structuring. The electronic device 700 further includes an electronic component 710 contained inside the outer housing 702.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A method of forming a logo on a device using a laser, comprising:
    laser forming a pattern on an outer surface of a housing of the device by activating at least a portion of the outer surface of the housing, wherein the housing includes an additive that is activated by irradiating the outer surface of the housing with the laser to form the pattern on the outer surface;
    plating a metal layer to the pattern after laser forming the pattern; and
    soldering a metal to the metal layer to generate a soldered metal forming the logo on the metal layer that is plated to the pattern on the outer surface of the housing.

2. The method of claim 1, wherein the housing includes a groove in the outer surface of the housing, and wherein forming the pattern on the outer surface of the housing comprises laser forming the pattern within a the groove.

3. The method of claim 1, wherein the housing includes a plurality of grooves in the outer surface of the housing, and wherein forming the pattern on the outer surface of the housing comprises laser forming the pattern within a the plurality of grooves.

4. The method of claim 1, wherein laser forming the pattern on the outer surface of the housing comprises laser forming the pattern on a flat outer surface of the housing.

5. The method of claim 1, wherein plating the metal layer to the pattern comprises placing the housing into a metallization bath containing a metal.

6. The method of claim 1, further comprising:
    laser forming a second pattern on the outer surface of the housing or another surface of the device; and
    plating a second metal layer to the second pattern, the second metal layer forming an antenna of the device in addition to the soldered metal forming the logo.

7. The method of claim 6, wherein laser forming the pattern on the outer surface of the housing and laser forming the second pattern are performed by a same manufacturing stage.

8. A method of forming a logo on a device using a laser, comprising:
    laser forming a pattern on an outer surface of a housing of the device;
    plating a metal layer to the pattern after laser forming the pattern, wherein plating the metal layer to the pattern comprises placing the housing into a metallization bath containing a metal; and
    soldering a metal to the metal layer to generate a soldered metal forming the logo on the metal layer that is plated to the pattern on the outer surface of the housing.

9. The method of claim 8, wherein the housing includes a groove in the outer surface of the housing, and wherein forming the pattern on the outer surface of the housing comprises laser forming the pattern within a the groove.

10. The method of claim 8, wherein the housing includes a plurality of grooves in the outer surface of the housing, and wherein forming the pattern on the outer surface of the housing comprises laser forming the pattern within a the plurality of grooves.

11. The method of claim 8, wherein laser forming the pattern on the outer surface of the housing comprises laser forming the pattern on a flat outer surface of the housing.

12. The method of claim 8, further comprising:
    laser forming a second pattern on the outer surface of the housing or another surface of the device; and
    plating a second metal layer to the second pattern, the second metal layer forming an antenna of the device in addition to the soldered metal forming the logo.

13. The method of claim 12, wherein laser forming the pattern on the outer surface of the housing and laser forming the second pattern are performed by a same manufacturing stage.

14. A method of forming a logo on a device using a laser, comprising:
    laser forming a pattern on an outer surface of a housing of the device;

plating a metal layer to the pattern after laser forming the pattern;

soldering a metal to the metal layer to generate a soldered metal forming the logo on the metal layer that is plated to the pattern on the outer surface of the housing;

laser forming a second pattern on the outer surface of the housing or another surface of the device; and plating a second metal layer to the second pattern, the second metal layer forming an antenna of the device in addition to the soldered metal forming the logo.

15. The method of claim 14, wherein laser forming the pattern on the outer surface of the housing and laser forming the second pattern are performed by a same manufacturing stage.

16. The method of claim 14, wherein the housing includes a groove in the outer surface of the housing, and wherein forming the pattern on the outer surface of the housing comprises laser forming the pattern within a the groove.

17. The method of claim 14, wherein the housing includes a plurality of grooves in the outer surface of the housing, and wherein forming the pattern on the outer surface of the housing comprises laser forming the pattern within a the plurality of grooves.

18. The method of claim 14, wherein laser forming the pattern on the outer surface of the housing comprises laser forming the pattern on a flat outer surface of the housing.

* * * * *